United States Patent [19]
Chen et al.

[11] Patent Number: 5,213,995
[45] Date of Patent: May 25, 1993

[54] METHOD OF MAKING AN ARTICLE COMPRISING A PERIODIC HETEROEPITAXIAL SEMICONDUCTOR STRUCTURE

[75] Inventors: Young-Kai Chen; Minghwei Hong, both of Berkeley Heights; Joseph P. Mannaerts, Summit; Ming-Chiang Wu, Bridgewater, all of N.J.

[73] Assignee: AT&T Bell Laboratories, Murray Hill, N.J.

[21] Appl. No.: 869,980

[22] Filed: Apr. 16, 1992

[51] Int. Cl.$^5$ .......................................... H01L 21/203
[52] U.S. Cl. .................... 437/126; 437/128; 437/247
[58] Field of Search ............... 437/105, 107, 126, 128, 437/129, 247; 148/DIG. 72

[56] References Cited

U.S. PATENT DOCUMENTS 4,900,372 2/1990 Lee et al. ........................... 437/126
5,079,616 1/1992 Yacobi et al. ....................... 437/126

OTHER PUBLICATIONS

"A Simple Way to Reduce Series Resistance in P-Doped Semiconductor Distributed Bragg Reflectors", by Hong et al., Journal of Crystal Growth, vol. 111 (1991), pp. 1071-1075.

"MBE Growth and Characteristics of Periodic Index Separate Confinement Heterostructure InGaAs Quantum-Well Lasers", by M. Hong et al., Journal of Electronic Materials, vol. 21, No. 2, 1992, pp. 181-185.

Primary Examiner—Brian E. Hearn
Assistant Examiner—C. Chaudhari
Attorney, Agent, or Firm—E. E. Pacher

[57] ABSTRACT

A novel method of making articles that comprise a periodic heteroepitaxial semiconductor structure is disclosed. The method pertains to growth of the periodic structure by MBE, CVD or similar growth techniques, and involves periodically changing the substrate temperature. For instance, a periodic multilayer GaAs/AlGaAs is grown by MBE, with the substrate temperature cycled between 600° C. and 700° C. The novel method can produce multilayer structures of uniformly high material quality.

7 Claims, 2 Drawing Sheets

METHOD OF MAKING AN ARTICLE COMPRISING A PERIODIC HETEROEPITAXIAL SEMICONDUCTOR STRUCTURE

FIELD OF THE INVENTION

This invention pertains to methods of making semiconductor devices that comprise a periodic heteroepitaxial structure, especially III-V semiconductor devices.

BACKGROUND OF THE INVENTION

Heteroepitaxial semiconductor structures can be found in many semiconductor devices, including electronic devices such as bipolar transistors, and opto-electronic devices such as LEDs and laser diodes. Although such devices generally are embodied in III-V semiconductor material, this is not necessarily so, and $Si/Si_xGe_{1-x}$ heteroepitaxial structures are known. Furthermore, it is likely that II-VI heteroepitaxial semiconductor devices will be commercialized in the future. Many devices (e.g., various laser types) comprise periodic heteroepitaxial structures.

By a "periodic" heteroepitaxial structure we mean a structure that comprises two or more pairs of semiconductor layers of predetermined thickness. Typically, the layers in a periodic heteroepitaxial structure are relatively thin, exemplarily less than 250 nm or even 150 nm.

By definition, a given pair of layers in a periodic heteroepitaxial structure comprises a first single crystal semiconductor region of a first composition that is contactingly overlain by a second single crystal semiconductor region of a second composition that differs from the first composition, with the crystal structure of the structure being continuous across the interface between the first and second regions. Generally, the lattice constant of the first composition material differs from that of the second composition material by at most a few (typically {2) percent.

A conventional technique for growing periodic heteroepitaxial structures is molecular beam epitaxy (MBE), which involves exposing an appropriate semiconductor substrate to a flux of particles (atoms, small clusters of atoms, or molecules) from one or more effusion cells. The substrate conventionally is maintained during MBE growth at a constant elevated temperature, and the composition of the incident flux is changed by means of a shutter or shutters, with all temperatures maintained constant. Recently, shutterless MBE growth, with the flux composition changed by changes in cell temperatures, has been disclosed. See M. Hong et al., *Journal of Crystal Growth*, Vol. 111, p. 1071 (1991); and M. Hong et al., *Journal of Electronic Materials*, Vol. 21, p. 181 (1992).

Other techniques for growing heteroepitaxial structures, including periodic ones, are also known. These include chemical vapor deposition (CVD), and variants thereof (e.g., MOCVD). All of these growth techniques have in common that typically the substrate is maintained at a fixed, predetermined elevated temperature, with composition changes effected by change of the composition of the growth medium, e.g., the precursor gas in contact with the substrate. By "growth medium" we mean herein the medium that provides the constituents of the growing semiconductor material. The term thus includes the particle flux of MBE as well as the precursor gas of CVD. It does not include, however, a melt.

As those skilled in the art will readily appreciate, in device applications the quality of the semiconductor material of the periodic heteroepitaxial structure, including the quality of the interface between two regions that differ in composition, is of major concern. Furthermore, high precision in layer thickness and composition is required in many devices that comprise periodic heteroepitaxial structures, e.g., distributed Bragg reflector mirrors in laser diodes. However, it is frequently at best difficult to achieve, by conventional growth techniques, the required precision of a few percent in layer thickness and composition of periodic multilayer structures, and at the same time obtain the required high quality in both the first and second composition materials.

Thus, a new growth technique which makes possible, inter alia, growth of highly precise periodic heteroepitaxial structures that consist of semiconductor material of high quality, would be highly desirable. Such a technique could yield devices of improved performance. This application discloses such a technique.

THE INVENTION

Figure 1:
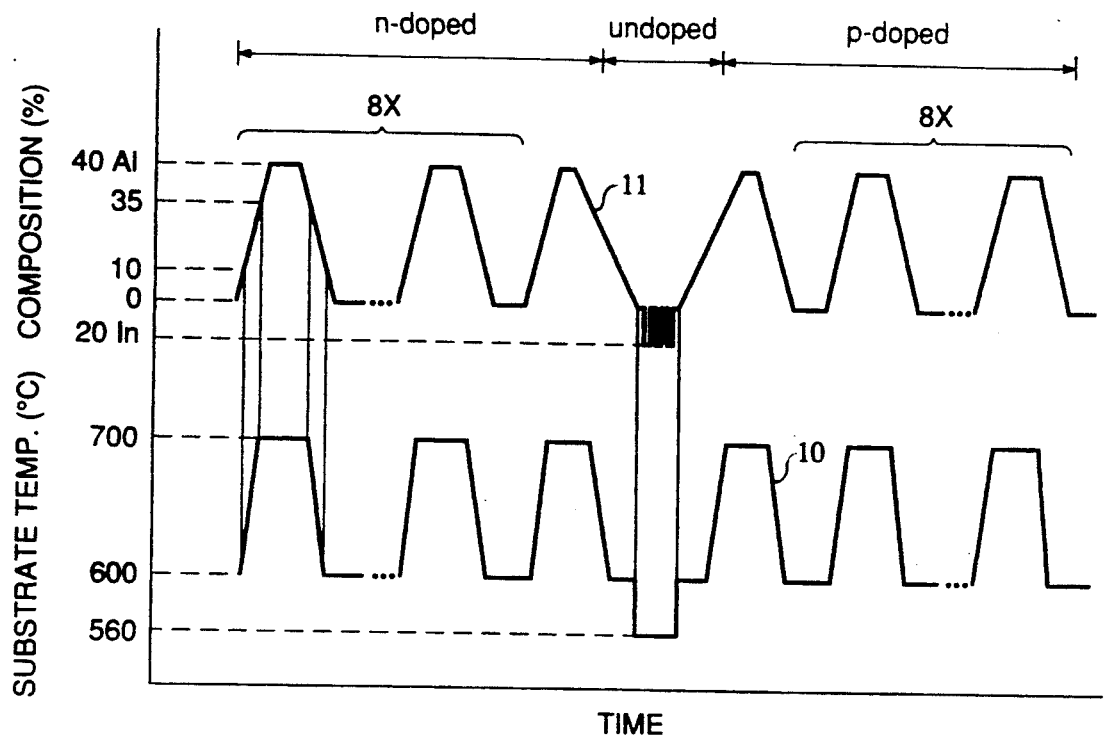
FIG. 1 schematically shows an exemplary temperature/time profile used in making a semiconductor device according to the invention. The figure furthermore shows the corresponding composition profile.

The invention involves a novel method of growing periodic semiconductor (preferably III-V, but not excluding $Si/Si_xGe_{1-x}$ and II-VI) heteroepitaxial structures. Such structures comprise a first semiconductor region (typically a layer) on a substrate, and a second semiconductor region (typically also a layer) on the first region, with the composition of the first region differing from that of the second. It will be understood that herein we define "substrate" broadly, to include semiconductor bodies with or without epitaxially grown semiconductor material thereon.

The inventive method comprises changing the substrate temperature during the growth of the first and second layers such that the substrate is during at least a major part of the first layer growth at a first temperature, and during at least a major part of the second layer growth at a second temperature that differs from the first temperature. The temperature change can be substantially step-like, or it can be continuous, either linear or non-linear. The choice between these possibilities depends on the details of the desired periodic heteroepitaxial structure, as those skilled in the art will appreciate.

More specifically, the invention is a method of making an article that comprises a periodic heteroepitaxial structure. The structure comprises two or more pairs of layers, a given pair comprising a first single crystal semiconductor layer of a first composition in contact with a second single crystal semiconductor layer of a second composition that differs from the first composition. The method comprises providing a substrate, exposing the substrate to a growth medium (as defined above) of a first composition such that the first semiconductor layer is formed on a major surface of the substrate, and exposing the substrate with the first semiconductor layer thereon to a growth medium of a second composition such that the second semiconductor layer is formed on the first semiconductor region. This process is repeated at least once. Significantly, during at least a part of said first exposing step the substrate is maintained at a first temperature, and during at least a part of the second exposing step the substrate is maintained at a second temperature that differs from the first temperature.

We have recognized that in many cases the optimal growth temperature for semiconductor material of the first composition differs from that of material of the second composition. For instance, at a growth temperature of 600° C., good crystal quality GaAs can be obtained, whereas at about 700° C. excellent crystal quality AlGaAs (exemplarily $Al_{0.4}Ga_{0.6}As$) can be obtained. Thus, in preferred embodiments of our invention the first and second temperatures are selected to substantially correspond to the optimal growth temperatures of first composition and second composition semiconductor material, respectively. IF not known already, the optimal growth temperature (or range of temperatures) for a particular semiconductor material can be readily determined, e.g., by growing samples of the material at various temperatures, and by evaluating the quality of the samples by, e.g., photoluminescence, X-ray diffraction or RHEED (reflection high energy electron diffraction).

Although the invention is broadly applicable, the remainder of this will deal primarily with the currently preferred semiconductor system, namely, III-V semiconductors, grown by the currently preferred technique, namely, MBE. More specifically, it will primarily deal with a specific periodic heteroepitaxial structure, namely, a GaAs/AlGaAs structure.

An exemplary device, namely, a PINSCH (periodic index separate confinement heterostructure) GaAs-based laser, was grown according to the invention, and its characteristics compared to that of an otherwise identical laser that was grown at the conventional (constant), substrate temperature ($T_S$) of 600° C.

FIG. 1 schematically shows the temperature/time profile (10) of the substrate during epitaxial growth. Shown in also the composition of the resulting layer structure (curve 11). As those skilled in the art will appreciate, the composition/distance diagram directly translates into a bandgap/distance diagram.

The exemplary laser comprises an undoped active region (three 7 nm thick $In_{0.2}Ga_{0.8}As$ quantum wells and four 20 nm thick GaAs barrier layers), with 8 pairs of doped PIN (periodic index) confinement layers on either side of the active region. Both Si- and Be-doped PIN layers are identical in composition (aside from the difference in doping) and thickness:GaAs and $Al_{0.4}Ga_{0.6}As$ with a nominal thickness of 125 nm. The compositionally graded regions between neighboring GaAs and $Al_{0.4}Ga_{0.6}As$ regions were 60 nm thick, with the grading being substantially linear. Doping levels were $1 \times 10^{18}$ cm$^{-3}$ for both p- and n-type.

The heterostructure of FIG. 1 was grown on a conventional GaAs wafer by solid source MBE. During growth of the PIN layers the growth rate was 1 μm/hr. The As beam flux was kept at the minimum level for the growth. The PIN layers were grown using modulation of the cell temperatures without any shutter operation, as described in the above-cited J. Electronics Materials article. The temperature of the Si and Be cells, respectively, were also modulated such as to generate the desired dopant profile. Specifically, the aluminum cell temperature was cycled between 930° C.($2 \times 10^{-8}$ Torr; yielding GaAs) and 1090° C.($1.4 \times 10^{-7}$ Torr; yielding $Al_{0.4}Ga_{0.6}As$), with the gallium cell temperature constant at 945° ($4.5 \times 10^{-7}$ Torr). The base pressure of the system was $2 \times 10^{-11}$ Torr.

During PIN layer growth, $T_S$ was 600° C. for growth of a GaAs layer, and 700° C. for growth of a $Al_{0.4}Ga_{0.6}As$ layer. More specifically, $T_S$ was computer controlled such that the temperature rose after the composition of the graded region reached $Al_{0.1}Ga_{0.9}As$, increased substantially linearly, reaching 700° C. when the composition of the graded region reached $Al_{0.35}Ga_{0.65}As$, remaining at 700° C. as long as the composition was more Al-rich than $Al_{0.35}Ga_{0.65}As$. The procedure was reversed for the decreasing-temperature part of the cycle, except that the rate of temperature change was lower (40° C./min. vs. 60° C./min.). $T_S$ was lowered to 560° C. for the active layer growth. The thus produced exemplary heteroepitaxial structure was then conventionally processed into ridge waveguide PINSCH lasers. A comparison structure was produced in the described manner, except that the PIN layers were grown at a constant of $T_S$ of 600° C. The comparison structure was identically processed into ridge waveguide PINSCH lasers.

Figure 2:
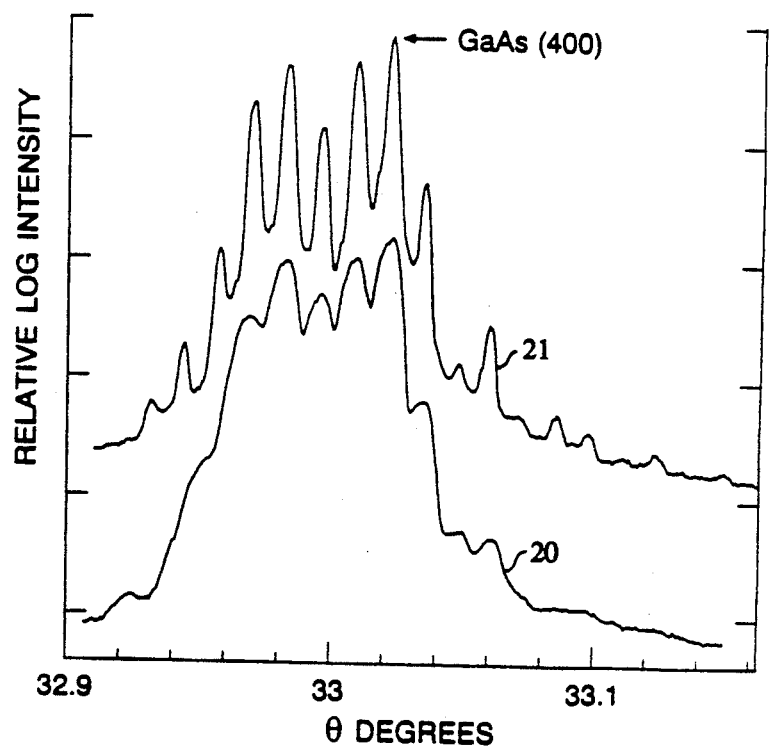
FIG. 2 presents X-ray diffraction data for an exemplary structure according to the invention and for an analogous prior art structure.

The quality of the semiconductor material was monitored in situ during PIN layer growth by means of RHEED. During growth of the comparison structure, the RHEED pattern showed a significant decrease of crystal quality after the growth of about 30 nm of $Al_{0.4}Ga_{0.6}As$, the lower quality persisting until about 20 nm of GaAs had been grown. On the other hand, during growth according to the invention the sharpness, elongation and intensity of the RHEED streaks remained constant throughout, indicating uniformly high quality of the material. The periodicity of the multilayer structure is substantially the same in the two structures, as evidenced by the high resolution X-ray diffraction data shown in FIG. 2. The figure shows X-ray intensity in the vicinity of the (400) reflection from two 8-period $Al_{0.4}Ga_{0.6}As$/GaAs PIN structures as described above, grown as described above, with numeral 20 referring to the structure grown according to the invention, and 21 to the conventionally grown structure.

Figure 3:
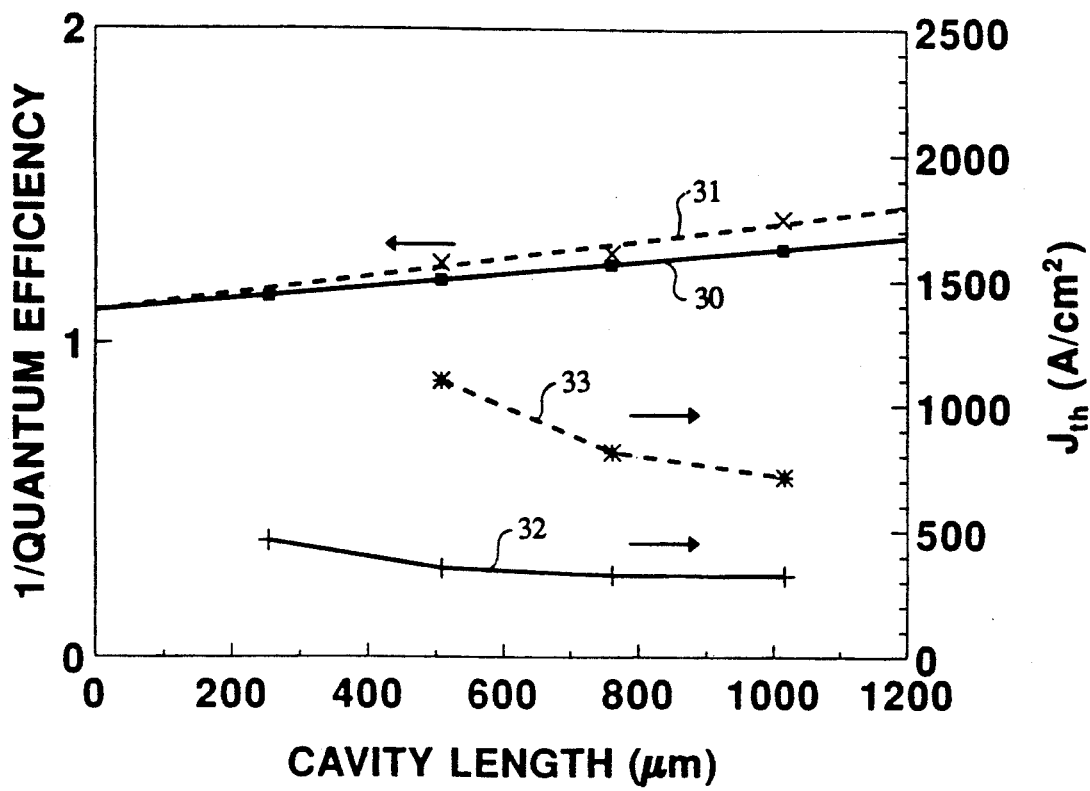
FIGS. 3 and 4 show data (quantum efficiency vs. cavity length; threshold current density vs. cavity length; and threshold temperature vs. temperature) of an exemplary laser according to the invention and an analogous prior art laser.
Figure 4:
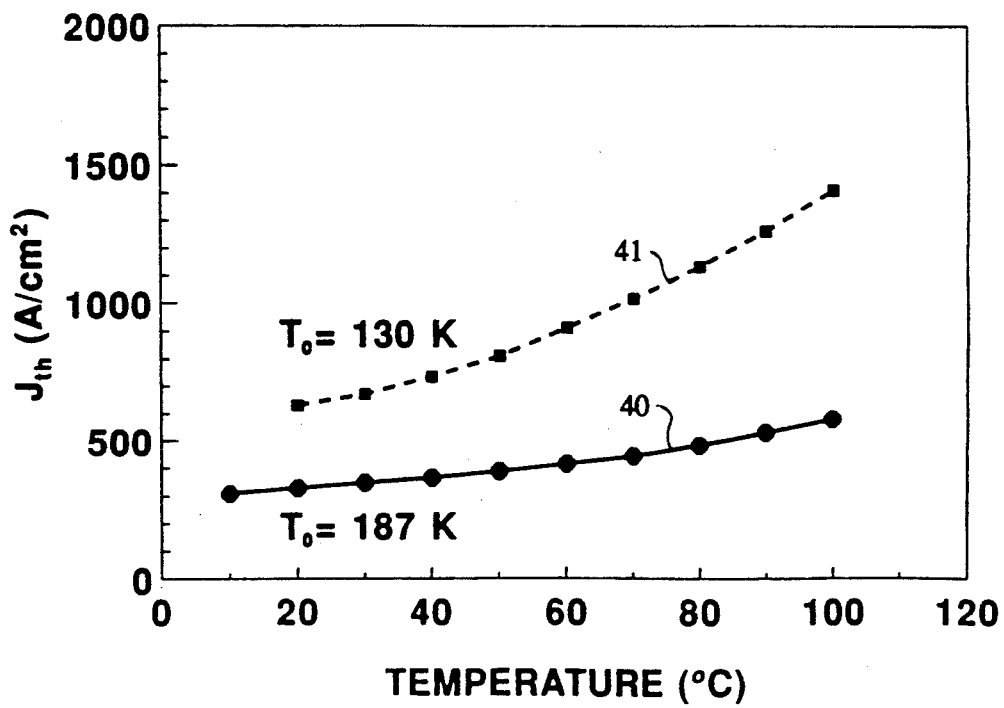

From the above described exemplary heterostructures we fabricated broad area (50 μm wide stripes) lasers, with cavity lengths from 200 to 1000 μm, by conventional techniques, and performed conventional measurements on the lasers. FIGS. 3 and 4 present some of the measurement results.

FIG. 3 shows the cavity length dependence of the reciprocal quantum efficiency and of the threshold current density, with the solid liens (30,32) pertaining to the lasers grown according to the invention, and the broken lines (31, 33) to the conventionally grown lasers. As can be seen, the former have substantially lower threshold current density than the former, and slightly higher quantum efficiency. The former also had a lower internal waveguide loss (exemplarily 2.2 cm$^{-1}$ vs. 3.1 cm$^{-1}$) for the lasers with 1000 μm cavity. FIG. 4 show exemplary data on the temperature dependence of the threshold current density of lasers with 750 μm long cavity. Again, the solid curve (40) pertains to the laser grown according to the invention, and the broken curve (41) to the conventionally grown laser. As can be seen, the former has a (desirably) higher characteristic temperature ($T_o=187K$) than the latter ($T_o=130K$).

The above exemplary comparison data show that the inventive growth technique can result in devices with improved characteristics, as compared to conventionally grown devices. The inventive technique has exemplarily also been applied to the growth of distributed Bragg reflectors (DBRs) in vertical cavity surface emitting lasers. The DBRs contained a quarter wave sequence of AlAs/GaAs layers, grown by MBE at 700° C. and 600° C., respectively.

We claim:

1. Method of making an article that comprises a periodic heteroepitaxial structure that comprises at least two pairs of semiconductor layers, a given pair comprising a first signal crystal semiconductor layer of a first composition in contact with a second single crystal semiconductor layer of a second composition that differs from the first composition, the method comprising
   a) providing a substrate;
   b) exposing the substrate to a growth medium of a first composition such that the first semiconductor layer is formed on a major surface of the substrate;
   c) exposing the substrate with the first semiconductor layer thereon to a growth medium of a second composition such that the second semiconductor region is formed on the first semiconductor region; and
   d) repeating steps b) and c) at least once; characterized in that
   e) during at least a part of step b) the substrate is maintained at a first temperature, and during at least a part of step c) the substrate is maintained at a second temperature that differs from the first temperature.

2. The method according to claim 1, wherein associated with the semiconductors of the first and second composition are, respectively, first and second optical growth temperature ranges, with said first and second temperatures being within the first and second optical growth temperature ranges, respectively.

3. The method of claim 1, wherein the periodic heteroepitaxial structure is a III-V heteroepitaxial structure.

4. The method of claim 1, wherein said first and second growth media are first and second particle fluxes, and the method comprises molecular beam epitaxy.

5. The method of claim 1, wherein said article comprises an opto-electronic device that comprises said periodic heteroepitaxial structure.

6. The method of claim 5, wherein the opto-electronic device is a laser.

7. The method of claim 6, wherein the first composition is GaAs and the second composition comprises Al and As, and wherein the first and second temperatures are about 600° C. and about 700° C., respectively.

* * * * *